United States Patent
Brooks et al.

(10) Patent No.: US 7,079,387 B2
(45) Date of Patent: Jul. 18, 2006

(54) COMPUTER COOLING SYSTEM AND METHOD

(75) Inventors: Michael A. Brooks, Sacramento, CA (US); Thane M. Larson, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 191 days.

(21) Appl. No.: 10/459,263

(22) Filed: Jun. 11, 2003

(65) Prior Publication Data

US 2004/0252453 A1  Dec. 16, 2004

(51) Int. Cl.
*G06F 1/16* (2006.01)

(52) U.S. Cl. ............... 361/687; 454/184; 62/259.2; 165/185

(58) Field of Classification Search ......... 361/679–687, 361/724–727, 695, 690; 454/184; 62/171, 62/259.2; 165/104.34, 185; 415/213.1
See application file for complete search history.

(56) References Cited

U.S. PATENT DOCUMENTS

| | | | | |
|---|---|---|---|---|
| 4,217,952 A | 8/1980 | Kelly | ............... | 165/293 |
| 4,399,485 A | 8/1983 | Wright et al. | ............... | 361/693 |
| 4,459,638 A * | 7/1984 | Brehm et al. | ............... | 361/697 |
| 4,860,163 A | 8/1989 | Sarath | ............... | 361/695 |
| 4,894,749 A | 1/1990 | Elko et al. | | |
| 4,953,058 A | 8/1990 | Harris | | |
| 5,210,680 A | 5/1993 | Scheibler | ............... | 361/695 |
| 5,276,585 A | 1/1994 | Smithers | | |
| 5,353,191 A | 10/1994 | Volz et al. | | |
| 5,375,655 A | 12/1994 | Lee | | |
| 5,381,305 A | 1/1995 | Harmon et al. | | |
| 5,414,591 A | 5/1995 | Kimura et al. | ............... | 361/695 |

(Continued)

FOREIGN PATENT DOCUMENTS

| | | |
|---|---|---|
| GB | 0412459 | 6/1934 |
| JP | 56-093154 | 7/1981 |
| JP | 62-042218 | 2/1987 |
| JP | 02-076299 | 3/1990 |
| JP | 05-206666 | 8/1993 |
| JP | 06-095764 | 4/1994 |
| JP | 06-164179 | 6/1994 |

OTHER PUBLICATIONS

Great Britain Search Report for United Kingdom Patent Application No. 0412460.8, dated Sep. 9, 2004, 3 pages.

*Primary Examiner*—Hung Van Duong

(57) ABSTRACT

A computer system includes an enclosure, a backplane within the enclosure, a replaceable unit releasably connected to the backplane, an air cooling system configured to create an air flow along the replaceable unit and an air flow blocking system. The air flow blocking system includes a first member coupled to the enclosure and a second member coupled to the replaceable unit. The first member and the second member interact to at least partially block air flow along the replaceable unit based upon at least one characteristic of the replaceable unit.

40 Claims, 7 Drawing Sheets

U.S. PATENT DOCUMENTS

| | | | |
|---|---|---|---|
| 5,428,503 A | 6/1995 | Matsushima et al. | 361/695 |
| 5,528,455 A | 6/1996 | Miles | |
| 5,793,610 A | 8/1998 | Schmitt et al. | 361/695 |
| 5,828,549 A | 10/1998 | Gandre et al. | |
| 5,862,038 A | 1/1999 | Suzuki et al. | |
| 5,886,871 A | 3/1999 | Jeffries et al. | |
| 5,912,802 A | 6/1999 | Nelson | |
| 5,914,858 A | 6/1999 | McKeen et al. | |
| 6,005,770 A | 12/1999 | Schmitt | 361/695 |
| 6,025,990 A | 2/2000 | Daskalakis et al. | |
| 6,031,717 A | 2/2000 | Baddour et al. | 361/687 |
| 6,034,870 A | 3/2000 | Osborn et al. | |
| 6,042,348 A | 3/2000 | Aakalu et al. | 417/423.5 |
| 6,047,836 A | 4/2000 | Miles | |
| 6,084,774 A | 7/2000 | Talbot et al. | |
| 6,115,250 A * | 9/2000 | Schmitt | 361/695 |
| 6,181,557 B1 | 1/2001 | Gatti | 361/695 |
| 6,217,440 B1 | 4/2001 | Wessel et al. | 454/184 |
| 6,278,608 B1 | 8/2001 | Ater et al. | |
| 6,315,655 B1 | 11/2001 | McEwan et al. | 454/184 |
| 6,317,320 B1 | 11/2001 | Cosley et al. | |
| 6,345,665 B1 | 2/2002 | Schulz-Harder | |
| 6,351,381 B1 | 2/2002 | Bilski et al. | |
| 6,381,147 B1 | 4/2002 | Hayward et al. | |
| 6,397,929 B1 | 6/2002 | Sterner | |
| 6,476,883 B1 | 11/2002 | Salimes et al. | 349/58 |
| 6,480,380 B1 | 11/2002 | French et al. | 361/690 |
| 6,483,699 B1 | 11/2002 | Salmonson et al. | |
| 6,483,700 B1 | 11/2002 | Malone et al. | |
| 6,504,718 B1 | 1/2003 | Wu | |
| 6,512,672 B1 | 1/2003 | Chen | |
| 6,515,858 B1 | 2/2003 | Rodriguez et al. | |
| 6,612,120 B1 * | 9/2003 | Patel et al. | 62/171 |
| 6,661,666 B1 | 12/2003 | Dauksher | |
| 6,707,676 B1 | 3/2004 | Geva et al. | |
| 6,724,624 B1 | 4/2004 | Dodson | |
| 6,781,831 B1 | 8/2004 | Banton et al. | |
| 6,853,554 B1 | 2/2005 | Bash et al. | |

* cited by examiner

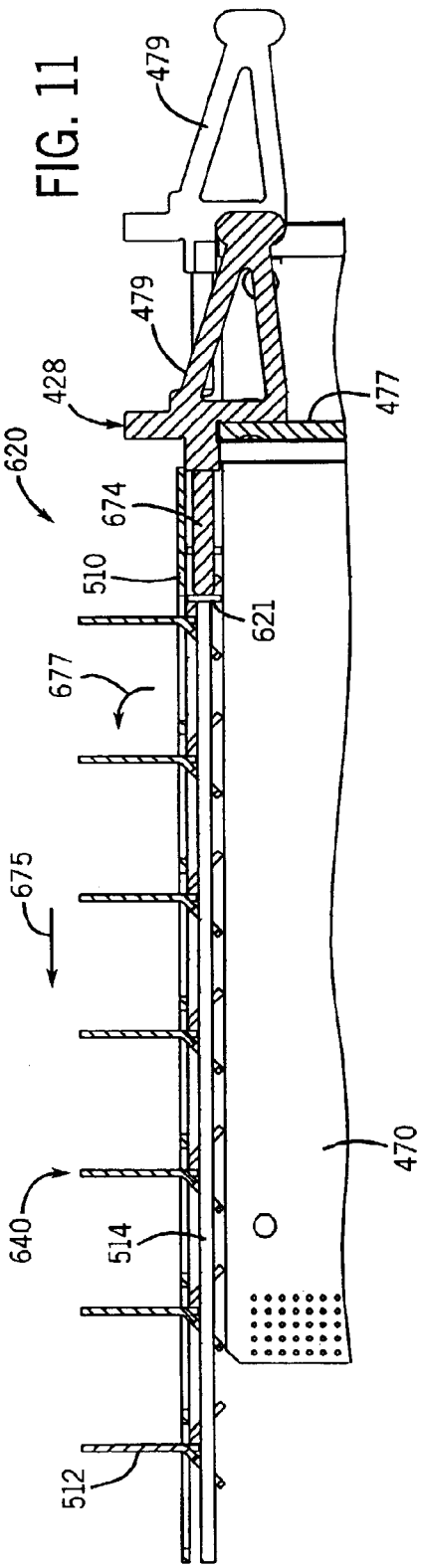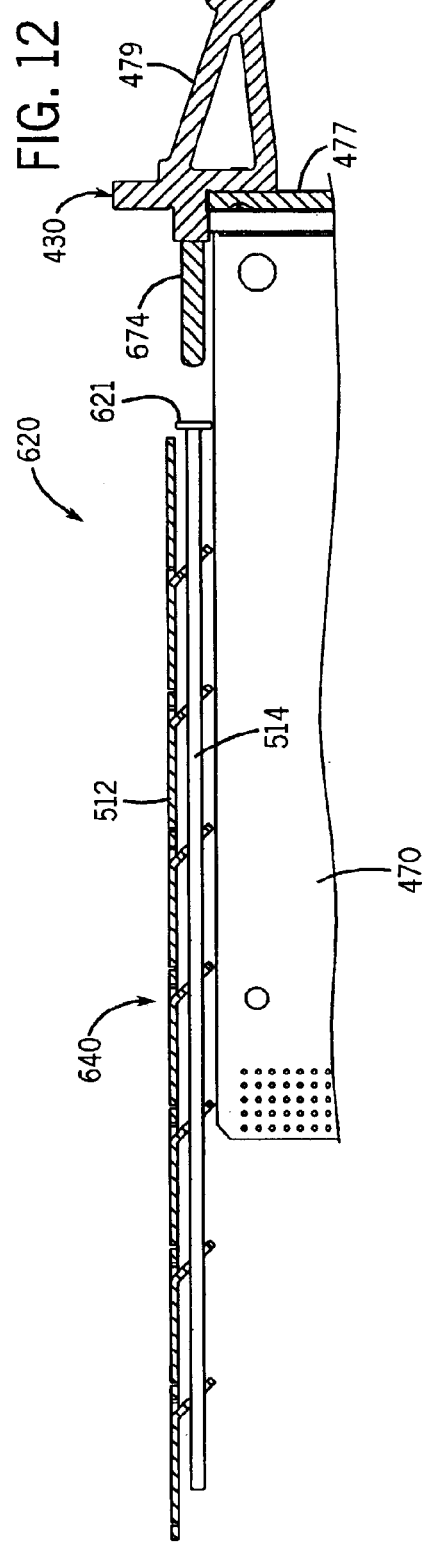

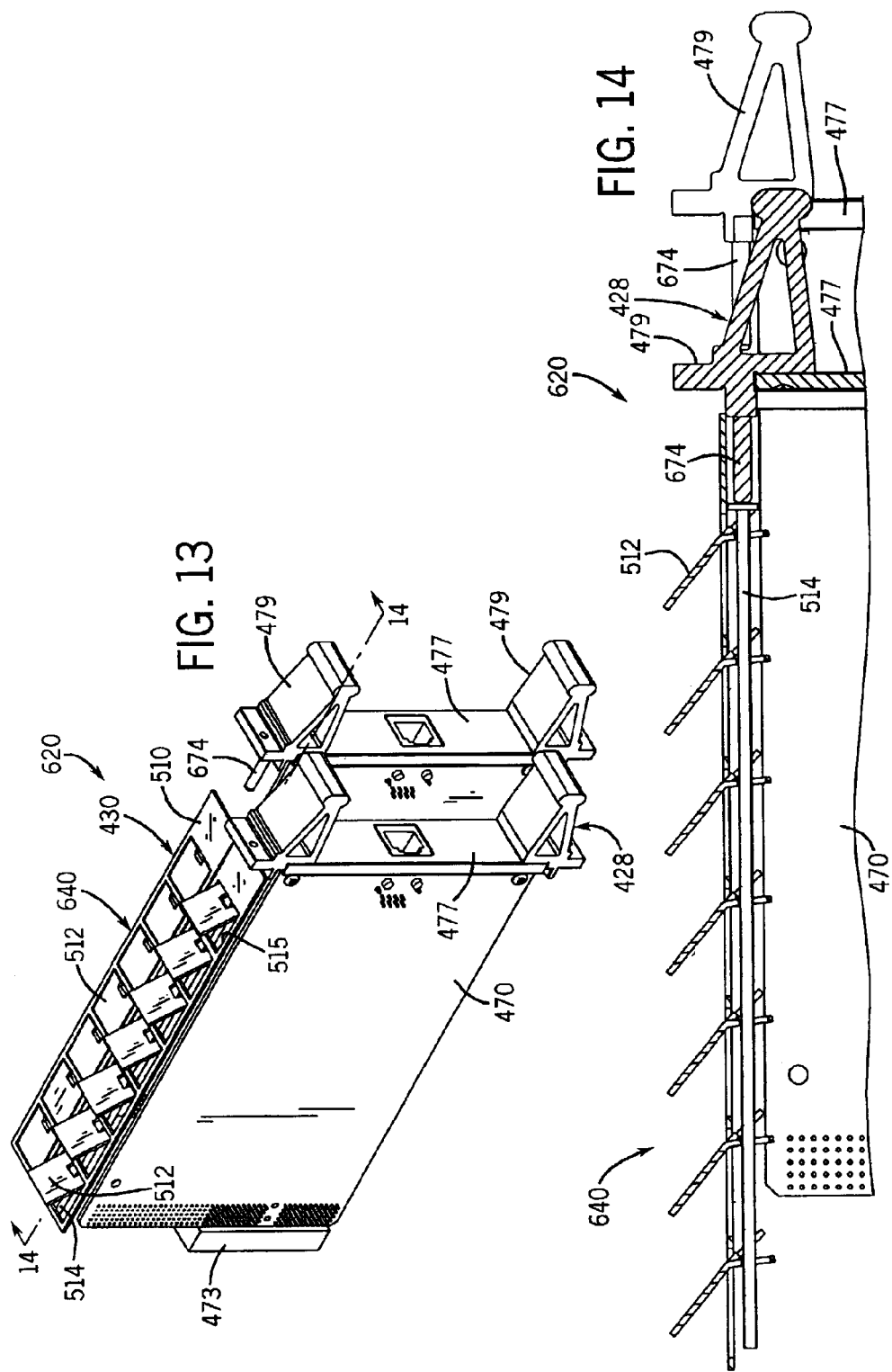

COMPUTER COOLING SYSTEM AND METHOD

CROSS-REFERENCE TO RELATED PATENT APPLICATIONS

The present application is related to co-pending U.S. patent application Ser. No. 10/459,301 entitled COMPUTER COOLING SYSTEM AND METHOD by Thane M. Larson and Michael A. Brooks and filed on the same date herewith, the full disclosure of which is hereby incorporated by reference.

BACKGROUND OF THE INVENTION

Computer systems typically employ a motherboard or backplane to which are connected a plurality of individual cards or blades. Cards typically carry a variety of different components such as central processing chips, IO devices, passive electronics and the like. Blades typically include such components as switches, routers, hard disk drives, modems, complete systems on a card and the like. The components of both cards and blades generate large amounts of heat that must be dissipated. Such systems typically include a forced air cooling system in which fans direct cooling air across the cards or blades.

In one known system, flow-blocking cards are used to completely block air flow across or through an otherwise open or empty slot or bay. By blocking the air flow across the empty slot or bay, air flow is increased adjacent to those slots or bays containing heat generating cards or blades.

BRIEF DESCRIPTION OF THE DRAWINGS

FIG. 11 is a sectional view of the computer system of FIG. 10 taken along line 11—11.

FIG. 12 is a sectional view of the computer system of FIG. 10 taken along line 12—12.

FIG. 13 is a front perspective view of the computer system of FIG. 10 illustrating an air flow blockage member in an intermediate open position.

FIG. 14 is a sectional view of the computer system of FIG. 13 taken along line 14—14.

DETAILED DESCRIPTION OF THE EXAMPLE EMBODIMENTS

Figure 1:
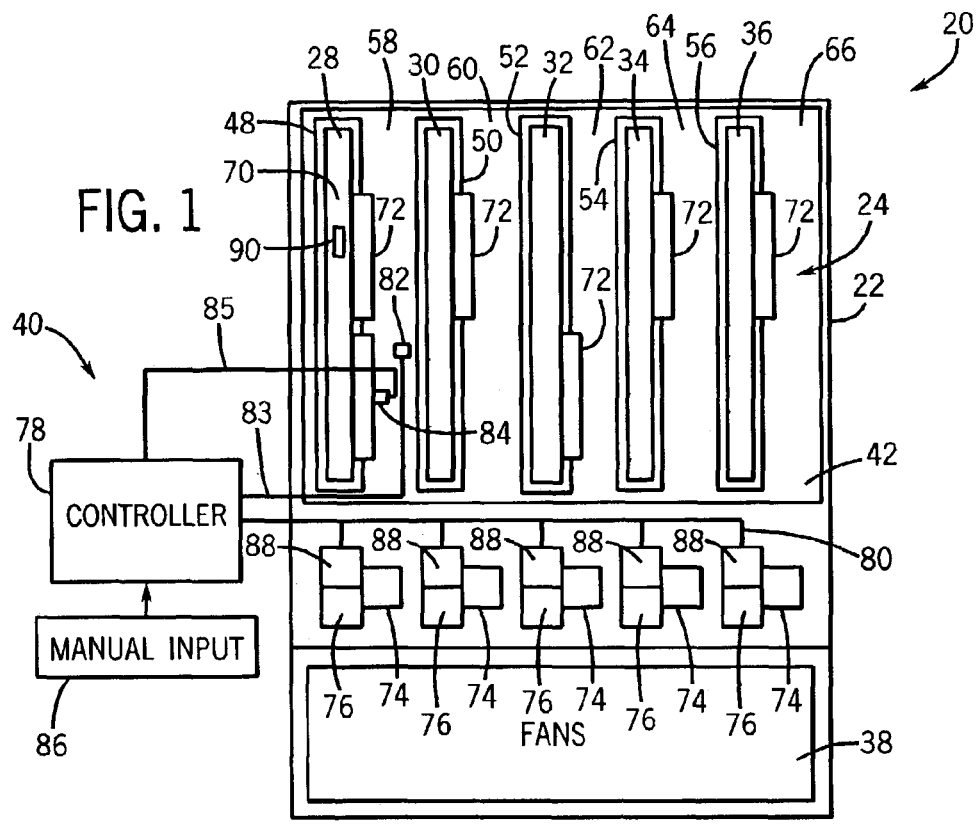
FIG. 1 is a schematic view of a computer system illustrating one embodiment of the present invention.

FIG. 1 is a schematic view of a computer system 20 which generally includes enclosure 22, mother board or backplane 24, replaceable units 28, 30, 32, 34, 36, forced air cooling system 38 and air flow blocking system 40. Enclosure 22 generally comprises one or more structures that support and substantially surround or enclose at least backplane 24, replaceable units 28, 30, 32, 34, 36, cooling system 38 and at least portions of air blocking system 40. In one embodiment, enclosure 22 may comprise a chassis and a lid or cover. The exact configuration of enclosure 22 may vary depending upon the particular characteristics of computer system 20.

Backplane 24 is supported within enclosure 22 and includes printed circuit board 42 and connectors 48, 50, 52, 54 and 56. Connectors 48, 50, 52, 54 and 56 are generally configured to electronically mate with replaceable units 28, 30, 32, 34 and 36, respectively. In one embodiment, connectors 48, 50, 52, 54 and 56 comprise slot or edge connectors which connect to edge portions of replaceable units 28, 30, 32, 34 and 36, respectively. In alternative embodiments, connectors 48, 50, 52, 54 and 56 may have other configurations depending upon the connecting structure or structures of replaceable units 28, 30, 32, 34 and 36. For example, connectors 48, 50, 52, 54 and 56 may alternatively comprise pin connectors or pin receptacles depending on the configuration of the replaceable units 28, 30, 32, 34 and 36. In particular embodiments, connectors 48, 50, 52, 54 and 56 may have distinct connector configurations or structures depending on the connecting configuration or structures of replaceable units to be connected to backplane 24.

Connectors 48, 50, 52, 54 and 56 are generally configured to support replaceable units 28, 30, 32, 34 and 36 parallel to one another and generally perpendicular to printed circuit board 42. Connectors 48 and 50 are generally separated from one another by volume or space 58. Connectors 50 and 52 are generally separated from one another by volume or space 60. Connectors 52 and 54 are separated from one another by space 62. Connectors 54 and 56 are separated from one another by space 64. Lastly, connector 56 is separated from an end of enclosure 22 (or another internal structure within enclosure 22) by volume or space 66. Although backplane 24 is illustrated as only including connectors 48, 50, 52, 54 and 56 and as being connected only to replaceable units 28, 30, 32, 34 and 36, backplane 24 may alternatively be connected to other backplanes, other printed circuit boards, additional integrated circuits, other cards or other internal devices. In addition, backplane 24 may include other active and/or passive components coupled to printed circuit board 42.

Replaceable units 28, 30, 32, 34 and 36 are connected to the printed circuit board 42 via connectors 48, 50, 52, 54 and 56, respectively. Each replaceable unit 28, 30, 32, 34 and 36 generally includes a printed circuit board 70 and at least one active or passive component 72 coupled to the printed circuit board 70. Each replaceable unit 28, 30, 32, 34 and 36 additionally includes a connector portion 73 (shown in FIG. 3) facilitating connection of printed circuit board 70 to one or more of connectors 48, 50, 52, 54 or 56.

Components 72 generally comprise conventionally known or future developed active or passive components.

Examples of conventionally known passive components include capacitors, resistors, inductors, LEDs and the like. Examples of conventionally known active components include routers, modems, integrated circuits, memory, processor, hard disk drives, controllers and the like. In one embodiment, components 72 are chosen such that one or more replaceable units 28, 30, 32, 34 or 36 comprises a blade. Blades typically include both active and passive components. In another embodiment, components 72 are chosen such that one or more of replaceable units 28, 30, 32, 34 or 36 comprises a card, such as a PCI card. Replaceable cards also typically include both active and passive components.

As shown by FIG. 1, replaceable units 28, 30, 32, 34 and 36 may include different components. In addition, replaceable units 28, 30, 32, 34 and 36 may have differently sized components or different component densities (variable spacing or number of components coupled to printed circuit board 70). Many of components 72 generate heat which must be removed or dissipated to avoid damage to replaceable units 28, 30, 32, 34 or 36 or other devices within system 20. Due to different components 72, different component sizes and different component densities, replaceable units 28, 30, 32, 34 and 36 also have distinct cooling requirements.

Forced air cooling system 38 generally comprises a device configured to generate or create an air flow generally directed towards connectors 48, 50, 52, 54 and 56 and through the spaces 58, 60, 62, 64 and 66. In the particular embodiment illustrated, forced air cooling system 38 includes one or more fans which blow towards spaces 58, 60, 62, 64 or 66 or draw air through spaces 58, 60, 62, 64 and 66. In particular, air flow from cooling system 38, absent any blocking by air flow blocking system 40, flows through spaces 58, 60, 62, 64 and 66 adjacent to components 72 to cool components 72 and then travels either out of enclosure 22 through one or more openings in enclosure 22 or into other portions of an interior of enclosure 22 to cool other devices within enclosure 22. The air flow will generally follow the path of least resistance. As a result, absent air flow blocking system 40, a large percentage of the air flow created by system 38 will travel through those spaces 58, 60, 62, 64 and 66 which have the least resistance. In other words, a larger percentage of air flow created by system 38 will travel through those spaces 58, 60, 62, 64 and 66 which are partially occupied the least by components 72 of replaceable units 28, 30, 32, 34 and 36. Likewise, air flow from system 38 is generally reduced in those spaces 58, 60, 62, 64 and 66 heavily occupied by component 72. However, in many instances, it is those replaceable units 28, 30, 32, 34 and 36 which heavily occupy adjacent spaces 58, 60, 62, 64 and 66 with densely arranged or larger components 72 that generate greater heat and require greater cooling or heat dissipation.

Air flow blocking system 40 generally comprises a system configured to selectively and differentially block and therefore selectively control air flow from system 38 through spaces 58, 60, 62, 64 and 66 to better meet the cooling or heat dissipation requirements of replaceable units 28, 30, 32, 34 and 36. As a result, air blocking system 40 increases air flow resistance adjacent to some of spaces 58, 60, 62, 64 and 66 and not to others to control cooling. For purposes of this disclosure, the term "blocking", by itself, is used in a broad sense so as to encompass both complete air flow blockage or partial air flow blockage.

In the embodiment shown in FIG. 1, air flow blocking system 40 generally includes air flow blockage members 74, actuators 76 and controller 78. Air flow blockage members 74 generally comprise structures (consisting of one or more individual elements coupled to one another) that are configured to block air flow from cooling system 38. Air flow blockage members 74 are generally positioned or situated along the air flow path from cooling system 38. In the embodiment shown in FIG. 1, air flow blockage members 74 are positioned in the air flow path between cooling system 38 and each of spaces 58, 60, 62, 64 and 66 so as to block air flow to the adjacent space without blocking air flow to other spaces. Air flow blockage members 74 are generally configured to block air flow to their respective adjacent spaces 58, 60, 62, 64 and 66 the same as or different as compared to air blocking being performed by other of air flow blockage members 74. In the embodiment illustrated, air flow blockage members 74 include one or more elements (individual structures) that move to effectuate different degrees of air flow blockage.

Air flow blockage members 74 move between a plurality of blocking positions including a fully closed position, a fully open position, and one or more intermediate open positions between the fully closed position and the fully open position. Although less desirable, therefore blockage members 74 may alternatively be configured to move between fewer of such positions. In one embodiment, air flow blockage members 74 pivot between such positions. In another embodiment, air flow blockage members 74 translate between such positions. In yet another embodiment, air flow blockage members 74 change their material characteristics to block air flow by varying degrees.

Actuators 76 generally comprise powered mechanisms coupled to air flow blockage members 74 and configured to move air flow blockage members 74 between different blocking positions. For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

In one embodiment, actuator 76 comprises an electrically powered actuator, such as a solenoid. In another embodiment, actuator 76 may comprise other forms of actuators, such as pneumatic actuators, hydraulic or other fluid-driven actuators or mechanical actuators such as those driven by one or more power trains coupled to an electric motor, engine or the like. Although system 20 is schematically illustrated as including an individual actuator 76 for each of air flow blockage members 74, system 20 may alternatively utilize actuator 76 coupled to greater than one, and possibly all, of blockage members 74 so long as such actuators 76 are configured to move each of their air flow blockage members between the blocking positions independent of one another.

Controller 78 generally comprises one or more processor units in communication with actuators 76 (as schematically illustrated by communication line 80) and configured to generate control signals, wherein actuators 76 move air flow blockage members 74 between the various blocking positions in response to such control signals. For purposes of the disclosure, the term "processor unit" shall include a conventionally known or future developed processing unit that executes sequences of instructions contained in a memory.

Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. Controller 78 is not limited to any specific combination of hardware circuitry and software, nor to any particular source for the instructions executed by the processing unit.

In one embodiment, controller 78 communicates with actuator 76 via electrical wiring or cabling or electrical traces. In yet other embodiments, controller 78 communicates with actuator 76 by other communication forms such as radio frequency waves, the transmission of optical signals and the like.

In the embodiment illustrated, controller 78 operates in one of several selectable modes for generating control signals transmitted to actuator 76 based upon alternative factors or factors utilized by controller 78 in conjunction with one another. In a first mode, controller 78 utilizes additional sensors 82 provided as part of system 20 and communicating with controller 78 as indicated by communication line 83. Sensors 82 are generally located within each of spaces 58, 60, 62, 64 and 66. However, for ease of illustration, only a single sensor 82 is shown. Sensor 82 generally comprises one or more individual sensing elements situated at one or more locations within space 58 and configured to sense at least one air characteristic within its associated space 58, 60, 62, 64 and 66. Examples of the at least one air characteristic which may be sensed by sensors 82 include air temperature, air velocity, air pressure, air flow direction and the like. Such information is transmitted or communicated to controller 78 by a communication line 83. Controller 78 generates control signals based upon such information which results in actuator 76 moving air flow blockage members 74 based on such information. For example, if a sensor 82 within space 58 senses insufficient air flow velocity through space 58, controller 78 may generate control signals such that actuator 76 moves air flow blockage members 74 adjacent space 58 so as to modify the blocking of air flow to increase air flow through space 58. Information from sensor 82 within one of spaces 58, 60, 62, 64 and 66 may also utilized by controller 78 to vary air flow through another of spaces 58, 60, 62, 64 and 66. For example, if sensor 82 within a space 58 senses an air flow temperature greater than a predetermined or calculated threshold or criteria, controller 78 may generate control signals such that an actuator 76 moves an air flow blockage member 74 adjacent to space 60 to increase the air blocking being performed by the air flow blockage member 74 adjacent space 60 which may result in increased air flow and greater heat dissipation through space 58. In particular applications, such thresholds or criteria may be based upon one or more characteristics of components 72 utilized when programming or configuring controller 78 or manually entered into controller 78. For example, component 72 of replaceable unit 30 may require temperatures no greater than a certain amount to avoid damage to the component 72. In such a circumstance, such threshold or criteria for the air temperature within space 60 may be established to avoid exceeding such safe operating temperatures of component 72 of replaceable unit 30.

In a second mode, controller 78 may generate the control signals based at least in part upon information from sensors 84 additionally provided as part of system 20. Sensors 84 generally comprise one or more individual sensing elements coupled to a component 72 or a plurality of components 72 of at least one and preferably all of replaceable units 20, 30, 32, 34 and 36 which are configured to sense a temperature of their associated components 72. For ease of illustration, only one sensor 84 is shown coupled to one of replaceable units 28. Sensors 84 communicate with controller 78 via communication line 85 which, like communication lines 80 and 83, may achieve communication by any of a variety of conventionally known or future developed communication mediums. Controller 78 utilizes the sensed information from sensors 84 to generate control signals which causes one or more of actuators 76 to move one or more of air flow blockage members 74. For example, if one of sensors 84 coupled to component 72 of replacement unit 30 senses information indicating that the temperature of the component 72 exceeds a predetermined threshold or criteria, controller 78 may generate control signals causing actuator 76 to move the air flow blockage member 74 adjacent space 60 to a larger open position to increase air flow through space 60 and to increase heat dissipation from the component 72. Controller 78 may also be configured to generate control signals such that an actuator 76 moves air flow blockage member 74 adjacent space 62 to increase blocking of air flow to space 62, thereby potentially increasing air flow through space 60. In particular circumstances, controller 78 may be configured to generate control signals such that both of the aforementioned actions are taken. The threshold temperature or criteria under which controller 78 operates based upon information from sensors 84 may be supplied by the manufacturer of the particular component 72 or may be programmed or entered into memory of controller 78.

In a third mode, controller 78 generates the control signals using information from a manual or peripheral input 86 additionally provided to system 20. Manual or peripheral input 86 generally comprises any conventionally known or future developed mechanism for enabling input to controller 78. Examples of manual or peripheral input 86 include a keyboard, a microphone, a mouse, a stylus and the like. Manual or peripheral input 86 may include a display displaying various choices and entry instructions. In one application, manual or peripheral input 86 independently or with the assistance of controller 78 facilitates entry of information that controller 78 utilizes to generate the control signals. For example, manual or peripheral input 86 may facilitate an individual specifically selecting the degree to which each of air flow blockage members 74 should block air flow to their associated spaces. Alternatively, manual or peripheral input 86 may facilitate the entry of information by an individual providing thresholds or criteria that controller 78 should utilize to generate the control signals. Examples of such criteria may be a maximum desired temperature as sensed by sensor 84, a maximum, minimum or preferred air characteristic as sensed by sensors 82 or information identifying the particular replaceable unit 28, 30, 32, 34 or 36 connected to printed circuit board 42 adjacent to each of spaces 58, 60, 62, 64 and 66, wherein controller 78 determines a criteria or threshold for generating control signals based upon the entered identification information. In still other embodiments, manual or peripheral input 86 alternatively enables the entry of information to controller 78 by communication with other computing devices through analog or digital signals or via portable storage media, such as disks, cassettes, cards and the like, which are read by manual or peripheral input 86.

In a fourth mode, controller 78 generates control signals based upon information received from one or more of detectors 88 additionally provided as part of air flow blocking system 40. Detectors 88 generally comprise structures or mechanisms configured to obtain information from the particular replaceable unit 28, 30, 32, 34, 36 connected via the connector 48, 50, 52, 54, or 56 and to transmit such information via a communication line 80 or another communication line to controller 78 which generates the control signals based at least in part upon such information. In one embodiment, detector 88 is configured to directly sense the actual characteristics of component 72 located within the corresponding space (one of spaces 58, 60, 62, 64, 66). For example, detector 88 may comprise an optical sensor which detects the volume or percent blockage of the corresponding space by component 72. In another embodiment, replaceable units 28, 30, 32, 34 and 36 are additionally provided with dedicated information sources 90 (schematically shown as to configuration and location) coupled to either printed circuit board 70 or at least one of components 72. Each replaceable unit 28, 30, 32, 34 and 36 includes a information source 90. However, for purposes of illustration, only a single information source 90 on replaceable unit 28 is shown.

Each information source 90 generally comprises a structure or mechanism for storing or otherwise providing information regarding the particular replacement unit to which information source 90 is coupled or air flow preferences for the adjacent space. Information source 90 is configured to cooperate with detector 88 to communicate such information to detector 88 which is then communicated to controller 78 for generating the control signals. For example, in one embodiment, information source 90 provides information regarding a maximum, minimum or preferred air characteristic for a space adjacent component 72 provided as part of the particular replaceable unit. In still another embodiment, information source 90 comprises an identifier which provides information identifying at least one characteristic of the particular replaceable unit to which information source 90 is coupled. For example, information source 90 may indicate a maximum allowable or preferred operating temperature of one or more components 72 provided as part of the replaceable unit, the type of components 72, the type or number of components 72 coupled to the printed circuit board 70 of the replaceable unit, the spacing, location or density of components 72 upon the printed circuit board 70 of the particular replaceable unit, or a name, class or other categorization of the particular replaceable unit, wherein controller 78 includes programming for generating control signals based upon the identifying information.

In those embodiments in which replaceable units 28, 30, 32, 34 and 36 are provided with information sources 90, various interactions between detector 88 and source 90 may be utilized to communicate information. In one embodiment, information source 90 includes recorded optical data and detector includes an optical reader. For example, information source 90 may comprise a bar code while detector 88 comprises a bar code reader. In still another embodiment, information source 90 may include recorded magnetic data, wherein detector 88 includes a conventionally device for reading such recorded magnetic data such as a magneto resistive read head. In still another embodiment, information source 90 may include an identifying circuit chip or other similar mechanism coupled to the replaceable unit, wherein detector 88 comprises circuitry configured to retrieve information from the chip or mechanism coupled to the particular replaceable unit. In still another embodiment, information source 90 may comprise an element coupled to the particular replaceable unit and having characteristics associated with a predefined set of information or characteristics stored in the memory of controller 78, wherein the detector 88 detects the particular characteristics of the element. For example, in one embodiment, information source 90 may include an armature having a characteristic associated with the particular characteristic of the replaceable unit that impacts cooling requirements, wherein detector 88 includes a transformer which detects the at least one armature characteristic.

Controller 78 may alternatively operate in each of the above-described modes. Alternatively, controller 78 may be configured to operate in two or more of the above-described modes, wherein the degree to which controller 78 generates control signals based upon information from various sources (e.g., sensors 82, sensors 84, information sources 90, manual or peripheral input 86) may be weighted in a particular manner or prioritized in a particular manner by controller 78. In one embodiment, controller 78 may include a manual input which enables an individual to select which particular mode or plurality of modes controller 78 uses to generate the control signals. In particular embodiments, computer system 20 and air flow blocking system 40 may alternatively be configured to provide only a single mode or less than all of the modes described.

As part of its programming or hardwire configuration, controller 78 may, in one embodiment, be configured to prioritize air flow and heat dissipation from replaceable units 28, 30, 32, 34 or 36 based upon information received from one or more of sensors 82, sensors 84, manual or peripheral input 86 or information source 90. For example, controller 78 may generate control signals such that actuator 76 actuate one or more of air flow blockage members 74 to effectuate increased air flow adjacent the more critical components of system 20, to more expensive components of system 20, to components 72 which have a history of higher failure percentages and the like. Controller 78 may also be configured to generate control signals that periodically or continuously vary the air flow blocking positions of one or more of air flow blockage members 74 in response to the information from one or more of sensors 82 and 84. In this manner, a closed loop feedback system may be established to provide optimum air flow. In alternative applications, controller 78 may be configured to generate control signals such that a balanced air flow or balanced air pressure exists across each of replaceable units 28, 30, 32, 34 and 36. In particular circumstances in which a connector 48, 50, 52, 54 or 56 is empty or is unconnected to a replaceable unit, detector 88 may be configured to detect the omission of a replaceable unit or controller 78 may be configured to utilize a default empty value in generating its control signals should no information be received from a sensor 84 or an information source 90 that would normally be associated with a replaceable unit connected to the connector.

Figure 2:
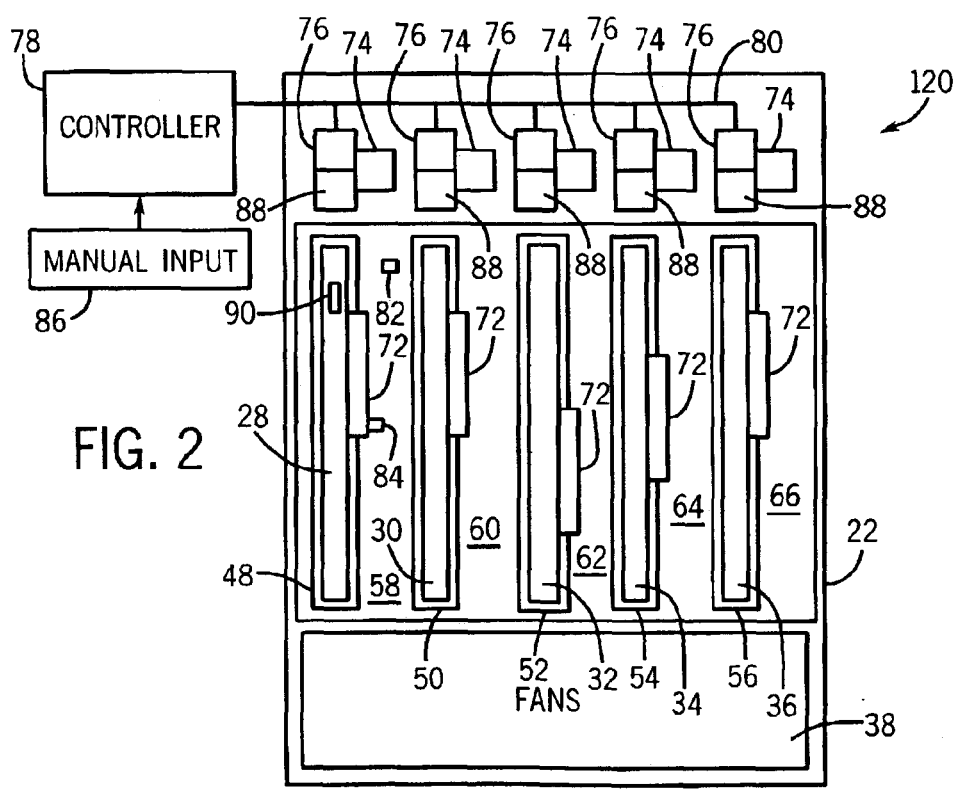
FIG. 2 is a schematic view of a first alternative embodiment of the computer system of FIG. 1.
Figure 3:
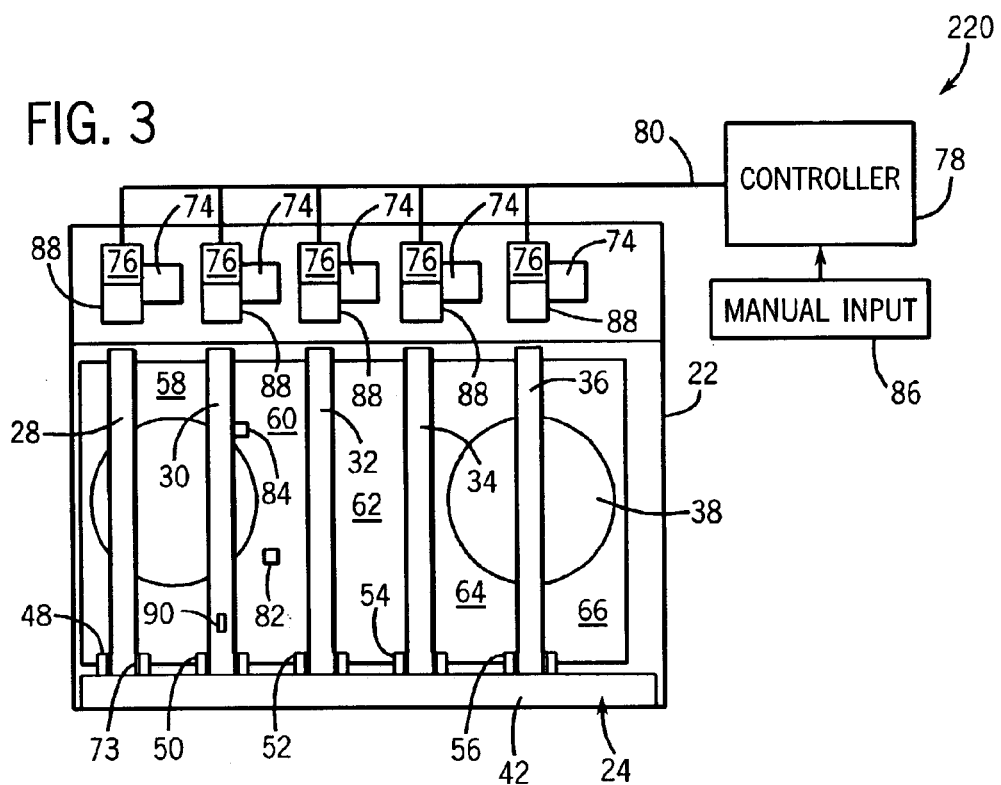
FIG. 3 is a schematic view of a second alternative embodiment of the computer system of FIG. 1.

FIGS. 2 and 3 schematically illustrate computer systems 120 and 220, respectively, alternative embodiments of system 20 shown in FIG. 1. Computer systems 120 and 220 are substantially identical to computer system 20 except that air flow blockage members 74 are repositioned within the air flow from cooling system 38 and relative to spaces 58, 60, 62, 64 and 66. In particular, air flow blockage members 74 are shown in FIG. 2 as being positioned opposite forced air cooling system 38 on a "downstream" side of replaceable units 28, 30, 32, 34 and 36. In such an embodiment, air flow from cooling system 38 passes through spaces 58, 60, 62, 64 and 66 until encountering any blockage provided by members 74. Any blockage by members 74 increases the amount of air pressure within the corresponding space to increase air flow through other spaces.

As shown by FIG. 3, air flow blockage members 74 are oriented at approximately 90 degrees relative to initial air flow coming from cooling system 38. In other words, air flow blockage members 74 are situated so as to extend generally parallel to connectors 48, 50, 52, 54 and 56 and opposite printed circuit board 42. In such an embodiment, air flow from-cooling system 38 flows across replaceable units 28, 30, 32, 34 and 36 and then turns so as to flow past air flow blockage members 74 if members 74 are not in a fully blocking position.

Figure 4:
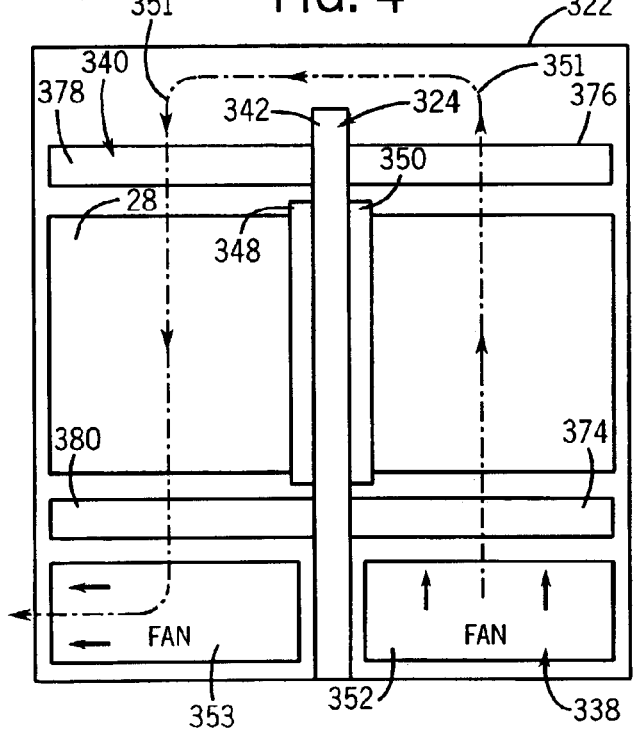
FIG. 4 is a schematic illustration of a third alternative embodiment of the computer system of FIG. 1.
Figure 5:
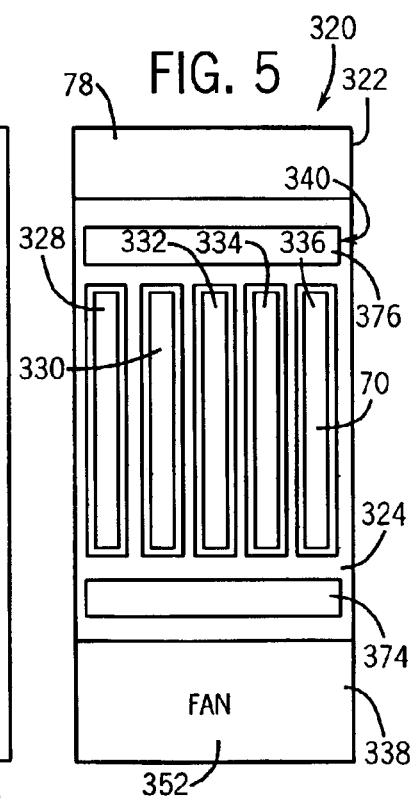
FIG. 5 is a side elevational view of the computer system of FIG. 4.

FIGS. 4 and 5 schematically illustrate computer system 320, a third alternative embodiment of computer system 20. Computer system 320 generally includes enclosure 322, backplane 324, replaceable units 28, 30, 32, 34 and 36 (shown in FIG. 1), replaceable units 328, 330, 332, 334 and 336, forced air cooling system 338 and air flow blocking system 340. Enclosure 322 is similar to enclosure 22 and generally constitutes a housing or structure about the remainder of system 320. Backplane 324 includes a printed circuit board 342 and a plurality of connectors 348 extending from a first side of board 342 and a second plurality of connectors 350 extending from a second opposite side of board 342. Connectors 348 and 350 are substantially identical to connectors 48, 50, 52, 54, 56. Connectors 348 are configured to connect replaceable units 28, 30, 32, 34 and 36 to a first side of board 342 while connectors 350 are configured to connect replaceable units 328, 330, 332, 334 and 336 to a second opposite side of board 342. Replaceable units 328, 330, 332, 334 and 336 are substantially identical to replaceable units 28, 30, 32, 34 and 36 in that replaceable units 328, 330, 332, 334, 336 each generally include a printed circuit board 70 and at least one active or passive component 72 (omitted from FIGS. 4 and 5 but shown in FIG. 1) coupled to the printed circuit board 70. The component 72 coupled to the printed circuit board 70 of replaceable units 328, 330, 332, 334, 336 may be identical to the components 72 and sets of components 72 provided by replaceable units 28, 30, 32, 34, 36 or may be different.

Forced air cooling system 338 creates air flow within enclosure 322 as generally indicated by air flow arrows 351. In particular, air flow created by a first fan 352 which flows through a plurality of spaces between replaceable units 328, 330, 332, 334 and 336 and across the components 72 provided by such replaceable units. The air flow executes a U-turn and then flows through spaces 58, 60, 62, 64 and 66 and across components 72 provided by replaceable units 28, 30, 32, 34 and 36. Lastly, the air flow indicated by arrows 351 is discharged by a second fan 353 which exhausts the air from enclosure 322.

Air flow blocking system 340 includes air flow blockage members 374, 376, 378, 380, actuators 76 (shown and described with respect to FIG. 1) and controller 78. Air flow blockage members 374, 376, 378 and 380 are substantially identical to air flow blockage members 74 (described with respect to FIG. 1). In particular, air flow blockage members 374, 376, 378 and 380 are situated along air flow path 351 and are movable between a plurality of positions to variably block air flow through the plurality of individual spaces between replaceable units 328, 330, 332, 334 and 336 and through the individual spaces 58, 60, 62, 64 and 66 between or along replaceable units 28, 30, 32, 34 or 36. For purposes of illustration, system 320 is illustrated as including four air flow blockage members: air flow blockage members 374 and 376 located on "upstream" and "downstream" sides of replaceable units 328, 330, 332, 334 and 336 and blockage members 378 and 380 located on "upstream" and "downstream" sides of replaceable units 28, 30, 32, 34 and 36. However, in alternative embodiments, less than all of the air flow blockage members 374, 376, 378 and 380 may be employed. For example, in one embodiment, system 320 may include or may omit the air flow blockage members 376 and 378. In another embodiment, the air flow blockage members 374 and 380 may be omitted. In another embodiment, the air flow blockage members 374 and 378 may be omitted. In still another embodiment, air flow blockage members 376 and 380 may be omitted.

Actuator 76 and controller 78 are identical to actuator 76 and controller 78 utilized in computer system 20. Although not illustrated, computer system 320 may additionally include sensors 82, sensors 84, manual or peripheral input 86 and information sources 90 (and their respective communication media). Overall, system 320 provides a compact arrangement of replaceable units which saves costs and space. Computer system 320 is particular useful as a bladed system in which the replaceable units constitute blades.

Figure 6:
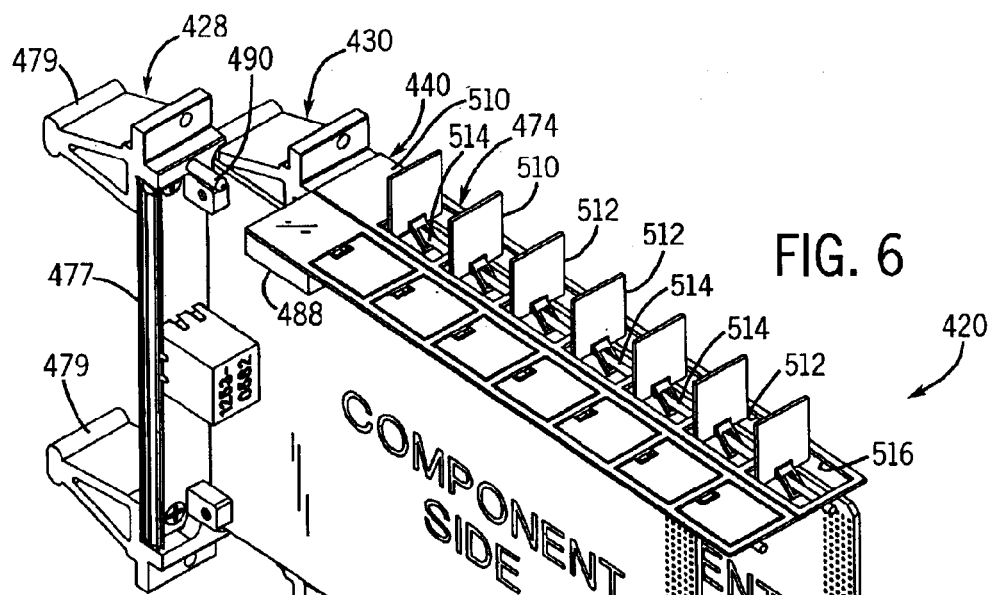
FIG. 6 is a rear perspective view of a portion of a fourth alternative embodiment of the computer system of FIG. 1.
Figure 7:
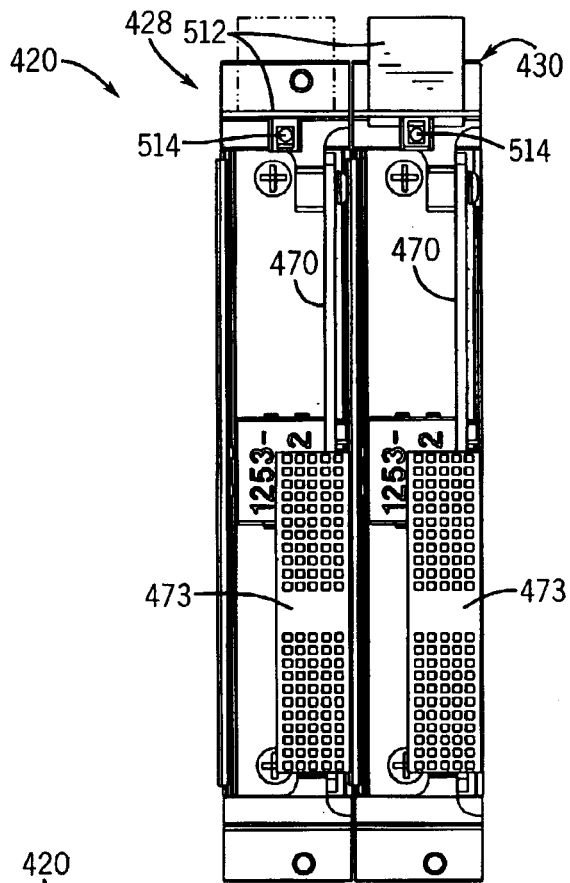
FIG. 7 is a rear elevational view of the computer system of FIG. 6.
Figure 8:
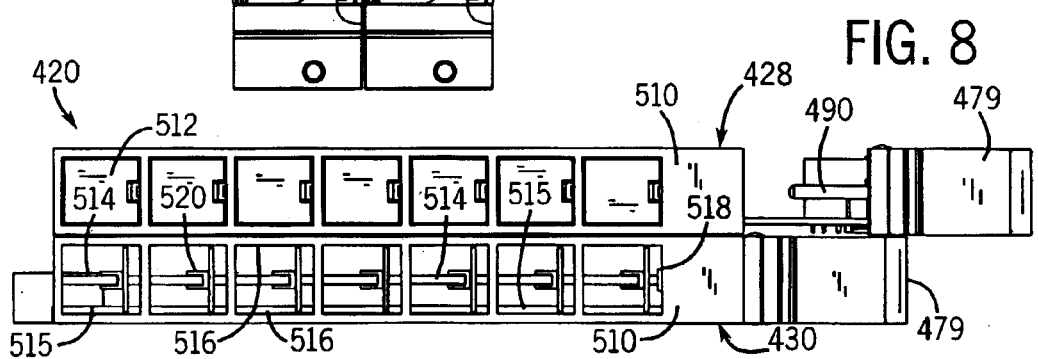
FIG. 8 is a top plan view of the computer system of FIG. 6.

FIGS. 6–8 illustrate portions of a computer system 420, a fourth embodiment of computer system 20. Computer system 420 includes enclosure 22, backplane 24, replaceable units 428, 430, as well as additional replaceable units (not shown), cooling system 38 and air flow blocking system 440. Enclosure 22, backplane 24 and cooling system 38 are illustrated and described with respect to computer system 20 in FIG. 1. As shown by FIGS. 6–8, replaceable units 428 and 430 each generally include a printed circuit board 470, at least one active or passive component 72 (schematically shown in FIG. 1) coupled to the "component side" of printed circuit board 470, and a connector portion 473 facilitating connection of printed circuit board 470 and the remainder of replaceable unit 428 or 430 to one of connectors 48, 50, 52, 54 or 56. As further shown by FIGS. 6–8, each replaceable unit 428, 430 additionally includes a face plate or bulkhead 477 having handles 479 to facilitate connection of each units 428 and 430 to backplane 24. The additional replaceable units of system 420 that are not shown are substantially identical to replaceable units 428 and 430 except that one or more of such replaceable units include at least one different components 72 supported on a component side of a printed circuit board 470.

Air flow blocking system 440 shown in FIGS. 6–8 is generally configured for use in a system such as shown in FIGS. 4 and 5 wherein the air flow blockage member generally extends in a plane perpendicular to the backplane to which replaceable units 428 and 430 are connected. Alternatively, system 440 may be configured for use in other systems. Although air flow blocking system 440 is illustrated for use with two units, system 440 may be enlarged for multiple units. For each unit, system 440 generally includes air flow blockage member 474, actuator 476 (shown in FIG. 9), detector 488 and information source 490. System 440 also includes a controller 478 (shown in FIG. 9). Air flow blockage member 474 generally includes frame 510, louvers 512, and piston 514. Frame 510 generally comprises a wall, panel or other substantially imperforate structure extending across the flow path created by the forced air cooling system 38 of the computer system proximate to component sides of a printed circuit board 470 of the replaceable units 428, 430 when the replaceable units are connected to backplane 24. Frame 510 is coupled to enclosure 22 and forms or defines openings 515 (also known as windows, doors, or passages) arranged in the flow path to permit air to pass therethrough if not completely blocked.

Louvers 512 generally comprise air flow blocking portions of member 474 that move between a plurality of blocking positions. Louvers 512 (also known as doors, flaps and covers) generally comprise imperforate members sized and configured so as to substantially block or occlude openings 515 when in a fully blocking or closed position. In alternative embodiments, louvers 512 may include perforations or may be made of materials that permit some air flow through the materials but would still prevent unencumbered air flow through openings 512 when in the fully closed position. Louvers 512 are each generally pivotally coupled to frame 510 at pivot points 516 (shown in FIG. 8) and are further pivotally coupled to piston 514 at points 520.

Piston 514 generally comprises an elongate rod or pin pivotally connected to each of louvers 512 and having an end portion 518 and configured to be engaged by actuator 476. Piston 514 is pivotally coupled to each of louvers 514 by pins at pivot points 520. Upon being engaged by actuator 476, piston 518 translates to simultaneously pivot each of louvers 512 between various positions depending upon the location of actuator 476. In the particular embodiment illustrated, louvers 512 pivot between a fully closed position in which openings 515 are fully occluded (as shown in FIG. 6 with respect to replaceable unit 428), a fully opened position in which louvers extend substantially perpendicular to openings 512 as illustrated in FIGS. 6 and 8 with respect to replaceable unit 430 and a second intermediate opened position such as shown in FIGS. 13 and 14. In one embodiment, air flow blocking system 440 additionally includes a spring coupled between frame 510 and piston 514 so as to resiliently bias piston 514 towards a predetermined position in which louvers 514 assume a predetermined and desired blocking position when actuator 476 is out of engagement with piston 514. In alternative embodiments, piston 514 may be permanently coupled to actuator 476 such that piston 514 moves in both directions depending upon the direction of movement of actuator 476.

Actuator 476 (shown in FIG. 9) generally comprises a mechanism configured to move piston to linearly translate piston 514 in at least one direction. In the particular embodiment illustrated, actuator 476 comprises an electric solenoid. In alternative embodiments, actuator 476 may comprise other electromechanical actuators such as servos, electric motors and the like. Actuator 476 moves piston 514 in response to control signals from controller 478.

Control circuit 578 generates control signals to control actuator 476 based upon signals from detector 488 and its interaction with information source 490. Information source 490 functions as an identifier to identify at least one characteristic of either replaceable unit 428 or replaceable unit 430 to its corresponding detector 488. In the embodiment illustrated, information source 490 comprises an elongate ferrous pin so as to function as an armature. In the particular embodiment illustrated, the pin forming information source 490 also serves to key each module or replaceable unit 428, 430 into position and into connection with backplane 424.

Detector 488 generally comprises a linear variance differential transformer (LVDT) having a primary winding 530 and a secondary winding 532 spaced for the reception of the pin of information source 490. The pin forming information source 490 has a characteristic associated with at least one characteristic of the replaceable unit (either unit 428 or unit 430 in FIG. 6) and which is detectable by detector 488. In the particular embodiment illustrated, the pin forming information source 490 has a length which identifies at least one characteristic of the replaceable unit to which it is coupled.

Figure 9:
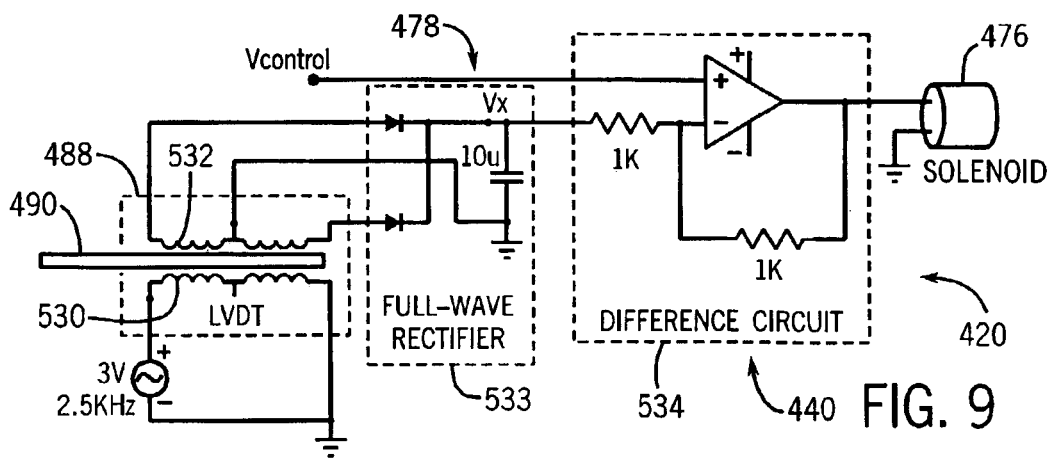
FIG. 9 is a schematic illustration of an air flow blocking system of the computer system of FIG. 6.

FIG. 9 illustrates controller 478 in greater detail. As shown by FIG. 9, control circuit 478 includes a full wave rectifier 533 and a different circuit 534. As further shown by FIG. 9, the input to the LVDT is 2.5 KHz, 3V AC voltage.

In operation, the length of the pin forming information source 490 affects the amount of coupling of primary winding 530 with secondary winding 532. As a result, the length of pin 490 linearly varies the secondary or output AC voltage across secondary winding 532. The output AC voltage is fed into full wave rectifier 533 which is illustrated as a bridge transformer circuit. Full wave rectifier 532 creates a DC voltage (Vx) that is proportional to the AC peak-to-peak voltage. The output DC voltage (Vx) is then input into different circuit 534 (illustrated as a differential operational amplifier) that measures the difference between the output voltage Vx and two times Vcontrol. The output of the different circuit (op/amp) drives actuator 476.

In the particular embodiment illustrated, the actual value of the output voltage Vx is dependent upon the number of windings that make up detector 488 as well as the exact material of pin 490. As a result, the output voltage Vx may be tuned to any range. In one embodiment, Vx is generally between 0 and 5 volts. In one embodiment, Vcontrol is voltage between negative 2.5 and 2.5 volts, thus allowing the application of any voltage between 0 volts and −10 volts to the solenoid (though only 0 to −5 volts would be supported). Although not shown, Vcontrol is generally created using a digital to analog converter and the solenoid voltage is read using an analog to digital converter. An additional feature of this embodiment is that the air flow blocking system progressively opens as the card or blade is installed. Thus a card or blade only partially seated will not open the air flow blocking mechanism fully and the rest of the system is protected against the unsealed opening.

Overall, air flow blocking system 440 automatically adjusts air flow adjacent to components 72 coupled to printer circuit boards 470 of the replaceable units by independently varying the degree to which air flow is blocked. System 440 automatically adjusts air flow to take into account the shape, power usage and component density of each replaceable unit. As a result, a consistent and predictable air flow across the components of each replaceable unit is achieved for maximum cooling and power efficiency is achieved. In addition, controller 478 may include additional electronics (not shown) which permit signals generated as a result of pin 490 to be overridden to provide manual adjustment of louvers 512 or to transmit other control signals to actuator 476 for movement of louvers 512 based upon other information.

Figure 10:
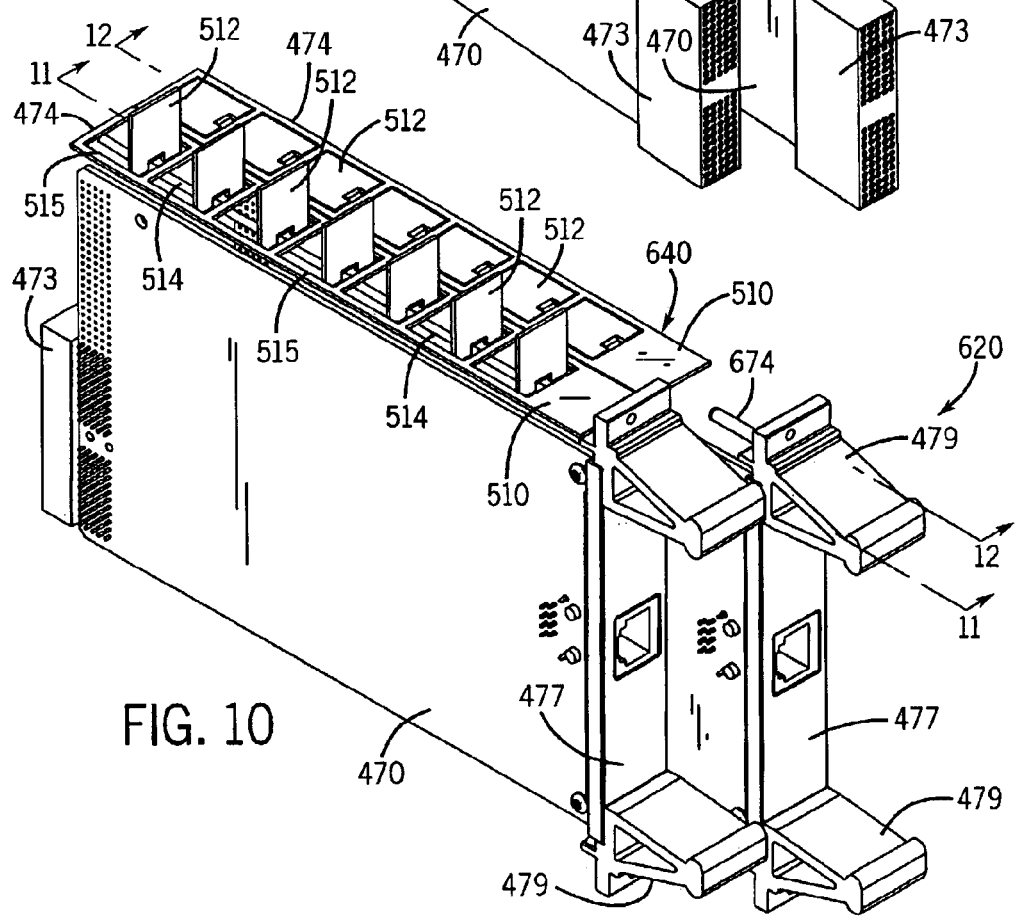
FIG. 10 is a front perspective view of a fifth alternative embodiment of the computer system of FIG. 1.

FIGS. 10–14 illustrate computer system 620, an alternative embodiment of computer system 420. Computer system 620 is substantially identical to computer system 420 except that computer system 620 includes air flow blocking system 640 in lieu of air flow blocking system 440. Air flow blocking system 640 is itself similar to air flow blocking system 440 except that air flow blocking system 640 includes air flow blockage member 674 in lieu of information source 490. Air flow blocking system 640 further omits actuator 476, controller 478 and detector 488. For ease of illustration, those remaining elements of system 620 which are the same as those elements of system 420 are numbered similarly. Air flow blockage member 674 generally comprises a member coupled to each of replaceable units 428, 430. Like information sources 490, members 674 serve to key their respective replaceable units 428, 430 to enclosure 22 to assist in aligning connector portions 473 with connectors on backplane 24. Like information sources 490, members 674 function as an identifier by having at least one characteristic associated with or corresponding to at least one characteristic of the associated replaceable unit 428, 430. In the particular embodiment illustrated, members 674 have lengths which vary depending upon at least one characteristic of the replaceable units 428, 430 from which they extend. Such characteristics may include power consumption, component density, component size, maximum operating temperatures permitted for components of the replaceable unit and the like. Unlike information source 490, members 674 are configured to physically contact and apply a force to an engagement portion 621 of piston 514 so as to translate piston 514 and so as to move and pivot louvers 512. The degree to which member 674 pivots or moves louvers 512 depends upon the length of member 674. For example, as shown by FIGS. 10 and 11, member 674 of replaceable unit 430 is provided with an axial length such that upon connection of connector portion 473 of unit 432 backplane 24, member 674 drives piston 514 in the direction indicated by arrow 675 to pivot louvers 512 in the direction indicated by arrow 677 to a fully open position in which louvers 512 extend generally perpendicular to frame 510. As a result, potential air flow through frame 510 is maximized to reduce air flow resistance adjacent to the components coupled to printed circuit board 470 of unit 430. This may be advantageous in instances such as when replaceable unit 430 includes components that require greater cooling or that already present substantial air flow resistance due to their size or density.

Alternatively, replaceable unit 430 may omit member 674 or may include a much shorter member 674 such that member 674 does not contact or apply a force to engagement portion 621 of piston 514 during connection of replaceable unit 432 backplane 24. As a result, louvers 512 are biased to a predetermined position when out of engagement with a member 674. As shown by FIG. 12, in the embodiment illustrated, louvers 512 are biased by gravity towards a fully closed position either when member 674 is omitted or has an insufficient length so as not to engage engagement portion 621 when the replaceable unit is connected to the backplane or when the replaceable unit is at least partially removed or disconnected from the backplane 24. Louvers 512 and piston 514 are generally biased to a fully closed position by gravity due to the location of pivot point 516 and the larger weight of each louver 512 extending to one side of pivot points 516. Although piston 514 and louvers 512 are illustrated as being biased by gravity towards a fully closed position, piston 514 and louvers 512 may alternatively be biased by gravity or other means to an alternative position in which louvers 512 are in a partially open state. Furthermore, in lieu of relying upon gravity, piston 514 and louvers 512 may alternatively be biased by a spring or other biasing means coupled between frame 510 or the enclosure 22 and piston 514 or louvers 512.

As shown by FIGS. 13 and 14, member 674 of replaceable unit 428 has a shorter length as compared to member 674 of unit 430 such that member 674 physically contacts and applies force to engagement portion 621 of piston 514 during insertion and connection of unit 428 to backplane 24 to pivot louvers 512 to a second intermediate open position. Such an intermediate open position partially restricts air flow through frame 510. This may be advantageous in circumstances where components 72 coupled to printed circuit board 470 of replaceable unit 428 have lower power consumption, produce less heat, have a lower density or smaller sizes, or require less cooling as compared to those components 72 coupled to printed circuit board 470 of replaceable unit 430 which requires louvers 512 to be in the fully open position. The exact degree or extent to which louvers 512 pivot to block air flow may be infinitely varied depending upon the length of member 674.

Overall, air blocking system 640 automatically adjusts any blockage of air flow across the replaceable units, such as replaceable units 428 and 430, to attain a consistent pressure drop across each space into which components 72 extend and across the enclosure 22 as a whole. System 640 enables specific and variable control of air flow adjacent to each replaceable unit based on the characteristics of the replaceable unit such as its cooling requirements, power consumption, component size or density. Because air flow blocking system 640 is completely mechanical in nature and relies solely upon physical interaction of components and forces occurring during the insertion and connection of the replaceable units to the backplane, system 640 works even if individual replaceable units are not powered or running. In particular embodiments, system 640 may be additionally provided with an electro-mechanical device such as shown and described with respect to system 440 such that the general mechanical setting established by the individual varying lengths of members 674 may be overridden using an actuator and a control circuit that generates control signals, wherein the actuator engages and moves an extension extending from engagement portion 621 to further move or pivot louvers 512.

Although system 640 is illustrated with air flow blockage member 474 coupled to enclosure 22 (or a card cage which also serves as part of enclosure 22) and with an air flow blockage member 674 coupled to each replaceable unit, such as units 428 and 430, this relationship may be reversed. In particular, member 674 may be coupled to and extending from a portion of enclosure 22, while each replaceable unit 428, 430 includes a member 474. In such an alternative embodiment, member 674 will preferably have a uniform length while pistons 514 of members 474 would have a varying length based upon at least one characteristic of the associated replaceable unit. For example, piston 514 may be configured in this embodiment so as to either (1) not engage member 674 such that louvers 512 remain biased in their fully closed positions, (2) engage member 674 to pivot louvers 512 to a fully open position, or (3) to engage member 674 such that piston 514 is moved so as to pivot louvers 512 to an intermediate open position. In such alternative embodiments, each replaceable unit may be provided with a customized set of louvers 514 as well as louver openings 512 for further control of air flow based upon characteristics of the particular replaceable unit.

Figure 15:
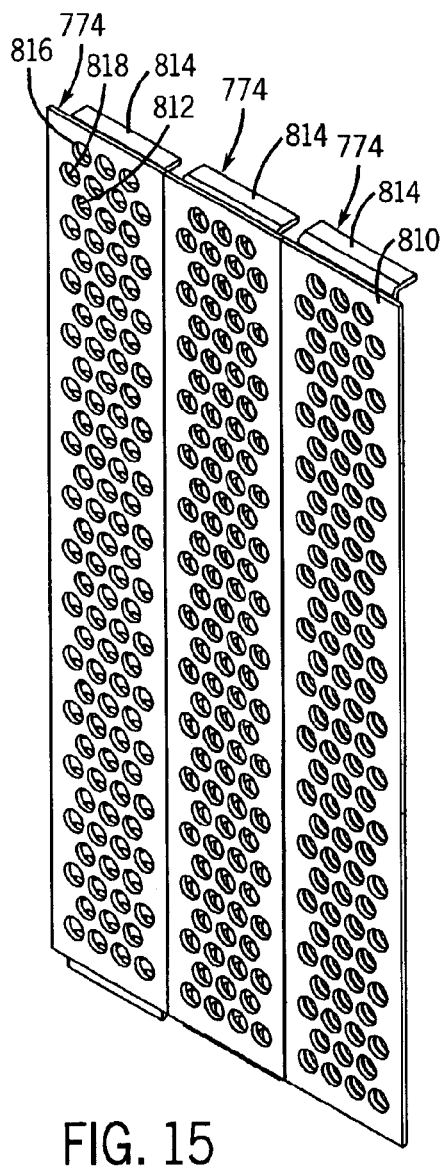
FIG. 15 is a perspective view of an alternative embodiment of the air flow blockage members of FIG. 13.
Figure 16:
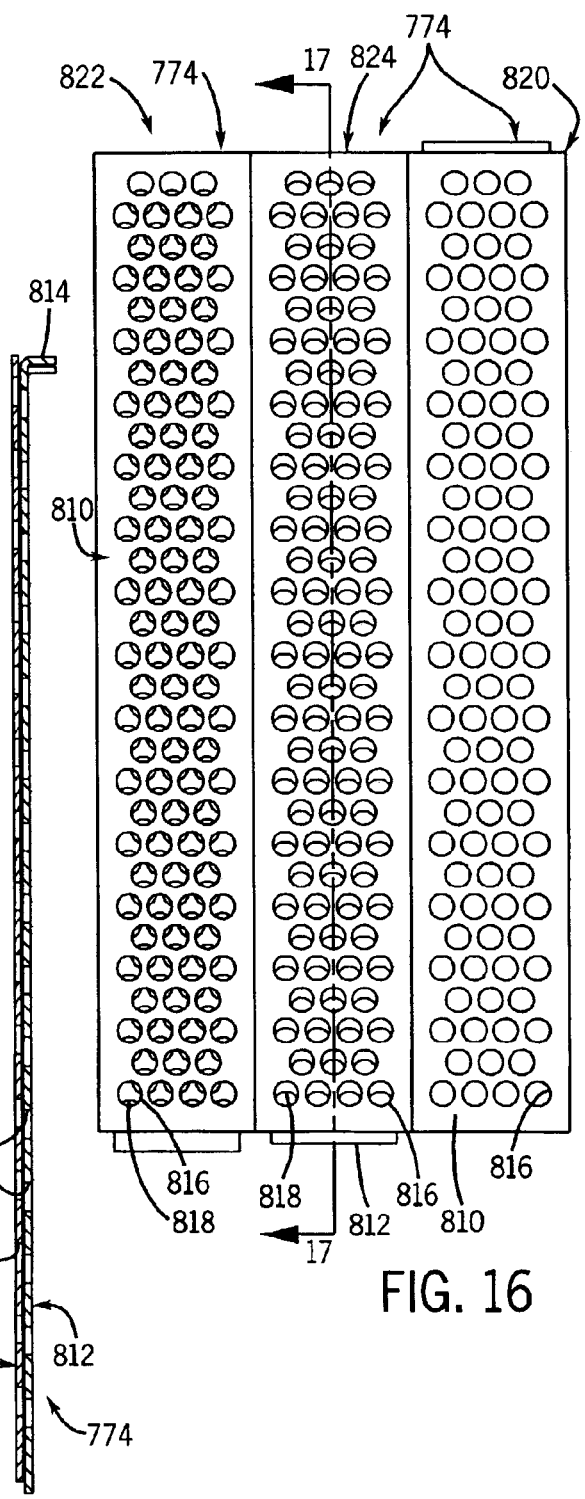
FIG. 16 is a top plan view of the air flow blockage members of FIG. 15.
Figure 17:
FIG. 17 is a sectional view of the air flow blockage members of FIG. 16 taken along line 17—17.

FIGS. 15–17 illustrate air flow blockage member 774, an alternative embodiment of air flow blockage member 474. FIGS. 15–17 illustrate three adjacent air flow blockage members 774 for use with three consecutive adjacent slots and spaces along three replaceable units. Each air flow blockage member 774 generally includes perforated plate 810, perforated plate 812 and engagement portion 814. Perforated plate 810 generally comprises an elongate plate having a plurality of perforations or openings 816. Each plate 810 is stationarily coupled to enclosure 22 adjacent to the space between adjacent replaceable units within the air flow path created by cooling system 38.

Plate 812 generally comprises a panel having a plurality of perforations or openings 818. Plate 812 is generally movable relative to plate 810 so as to reposition openings 818 relative to openings 816 which results in a blocking of air flow to different extents or degrees. Plate 812 is movably supported relative to plate 810 via channels or spaced apart and underlying supporting tabs integrally formed with or mounted to either enclosure 22 or plate 810.

As best shown by FIG. 16, plate 812 may be moved relative to plate 810 between a fully open position 820 in which openings 818 are substantially aligned with openings 816, a substantially closed position 822 in which openings 818 are substantially out of alignment with openings 816 to minimize air flow through member 774, and an intermediate open position 824 in which openings 818 are in partial alignment with openings 816 to facilitate less than full air flow through member 774 but air flow through member 774 that is greater than position 822.

Engagement portion 814 comprises an extension protruding from plate 812 and configured to be engaged to facilitate movement of plate 812 relative to plate 810. In embodiments where actuator 476 is permanently coupled to engagement portion 814, actuator 476 moves plate 812 in both directions. In embodiments where actuator 476 is configured to only move plate 812 in a single direction, plate 812 is resiliently biased to the other opposite direction by a spring coupled between plate 812 and either plate 810 or a portion of enclosure 22. Depending upon the configuration and orientation of the computer system in which air flow blockage member 774 is employed, plate 812 may alternatively be biased by gravity.

In alternative embodiments, air flow blockage member 774 may alternatively be provided as part of or coupled to a replaceable unit such as replaceable units 428 and 430. For example, air flow blockage member 774 may be coupled to the replaceable unit in substantially the same position as frame 510 is illustrated in FIG. 6. In such an alternative embodiment, the system is further provided with an actuator for engaging and moving plate 812 relative to plate 810 to different degrees to achieve different air flow blocking characteristics. In still another embodiment, plate 812 includes an engagement portion 814 which extends or projects beyond plate 810 by varying distances depending upon characteristics of the replaceable unit to which air flow blockage member 774 is coupled. Enclosure 22 would include a plurality of uniformly sized air flow blockage members 674 which engage engagement portions 814 of plate 812. As a result, connection of a replaceable unit to a backplane of a system would result in the member 674 extending from enclosure 22 to engage engagement portion 814 so as to move plate 812 relative to plate 810 by varying extents based upon configuration of engagement portion 814 which is based upon at least one characteristic of the replaceable unit to which engagement member 774 is coupled.

Although plates 810 and 812 are described with respect to FIGS. 15–17 as part of a single air flow blockage member 774 that is coupled to enclosure 22, plates 810 and 812 may alternatively be coupled to enclosure 22 and a replaceable unit, respectively. In particular, plate 810 may be stationarily coupled to enclosure 22 while plate 812 is stationarily coupled to a replaceable unit such as unit 428 or 430 in generally the same orientation as frame 510 is shown in FIG. 6. In such an alternative embodiment, replaceable units having different characteristics such as different components, different component densities, different heat generation properties, different cooling requirements, different power consumption and the like also have a perforated plate 812 having differently configured openings 818. Openings 818 may be configured differently by varying the size of the openings 818, the location of the openings 818 or the density of the openings 818. As a result, the different perforated plates 812 of the different replaceable units interact differently with plate 810 to achieve varying or different air flow blocking characteristics based on the particular characteristics of the replaceable unit. In one embodiment, connecting of a particular replaceable unit to a backplane 24 results in plate 812 extending adjacent to plate 810. Direct physical contact between plates 810 and 812 is not necessary to achieve air flow blocking interaction between openings 818 and 816.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. A computer system comprising:

an enclosure;

a first printed circuit board;

a first connector coupled to the first printed circuit board;

a second connector coupled to the first printed circuit board;

a forced air cooling system configured to direct air flow towards the first connector and the second connector;

a first replaceable unit having a second printed circuit board releasably connected to the first printed circuit board by the first connector and a first component coupled to the second printed circuit board and located within a first space;

a second replaceable unit having a third printed circuit board releasably connected to the first printed circuit board by the second connector and a second component different than the first component, coupled to the third printed circuit board and located within a second space;

a first air flow blocking system including:

a first member coupled to the enclosure; and a second member coupled to the first replaceable unit, wherein the first member and the second member interact to partially block air flow to the first space by a first degree; and a second air flow blocking system including a third member coupled to the enclosure and a fourth member coupled to the second replaceable unit, wherein the third member and the fourth member interact to partially block air flow to the second space by a second degree different than the first degree.

2. The system of claim 1, wherein the first member has an air flow blocking portion that pivots when the first member interacts with the second member.

3. The system of claim 1, wherein the first member translates when interacting with the second member.

4. The system of claim 1, wherein the first member includes at least one louver configured to pivot between a plurality of different air blocking positions and wherein the at least one louver is biased to a predetermined position.

5. The system of claim 1, wherein the first member includes a first perforated plate and wherein the second member includes a second perforated plate and wherein the first perforated plate and the second perforated plate interact with one another to block air flow to a first space by a first degree.

6. The system of claim 1, wherein the second member applies a force to the first member to move at least a portion of the first member during connection of the second printed circuit board to the first printed circuit board.

7. The system of claim 2, wherein the air flow blocking portion includes at least one first louver and wherein the first member further includes a first piston coupled to the at least one first louver, and wherein the first piston pivots the at least one first louver while interacting with the second member.

8. The system of claim 3, wherein the first member includes:
   a first perforated plate; and
   a second perforated plate movable relative to the first perforated plate, wherein the second perforated plate translates relative to the first perforated plate during interaction of the first member and the second member.

9. The system of claim 5, wherein the third member includes a third perforated plate and wherein the fourth member includes a fourth perforated plate and wherein the third perforated plate and the fourth perforated plate interact with one another to block air flow to the second space by a second degree different than the first degree.

10. The system of claim 5, wherein the second perforated plate includes a plurality of perforations and wherein at least one of a size, density and location of the plurality of perforations is based upon a characteristic of components coupled to the second printed circuit board.

11. The system of claim 7, wherein the second member includes a first pin configured to engage the first piston during interaction of the first member and the second member.

12. The system of claim 8, wherein the first member includes an engagement surface coupled to the second perforated plate and configured to engage the second member during interaction of the first member and the second member.

13. The system of claim 8, wherein the second perforated plate is resiliently biased to a predetermined position relative to the first perforated plate.

14. The system of claim 9, wherein the first member is substantially identical to the third member.

15. The system of claim 11, wherein the third member includes at least one second louver and a second piston coupled to the at least one second louver, wherein the second piston pivots the at least one second louver of the third member while interacting with the fourth member.

16. The system of claim 15, wherein the fourth member includes a second pin configured to engage the second piston during interaction of the third member and the fourth member, wherein the second pin has a length different than a length of the first pin.

17. A computer subsystem for use with a plurality of replaceable units, each unit having a first member of an air flow blocking system, the computer subsystem including:
   an enclosure;
   a first printed circuit board having a plurality of connectors separated by a plurality of spaces, each of the plurality of connectors being adapted to connect one of the plurality of replaceable units to the first printed circuit board;
   a forced air cooling system configured to direct air flow towards the plurality of connectors; and
   a second member of the air flow blocking system adjacent at least one of the plurality of spaces, wherein the second member is configured to interact with the first member to block air flow from the forced air cooling system.

18. The subsystem of claim 17, wherein the first member includes a first perforated plate and wherein the second member includes a second perforated plate.

19. The subsystem of claim 17, wherein the second member includes:
   a first perforated plate; and
   a second perforated plate movable relative to the first perforated plate.

20. The subsystem of claim 17, wherein the second member has an air flow blocking portion that pivots when interacting with the first member.

21. The subsystem of claim 20, wherein the air flow blocking portion includes at least one louver and wherein the second member further includes a piston coupled to the at least one louver and wherein the piston pivots the at least one louver while interacting with the first member.

22. The subsystem of claim 20, wherein the air flow blocking portion pivots between a fully closed position, a first open position and a second open position.

23. A replaceable unit for use with a computer system having a forced air cooling system, a first printed circuit board having a plurality of connectors, and a first member of an air flow blocking system, the unit comprising:
   a second printed circuit board configured to be connected by one of the plurality of connectors to the first printed circuit board; and
   a second member of the air flow blocking system, wherein the second member is configured to interact with the first member to at least partially block air flow adjacent the unit when the unit is connected to the first printed circuit board.

24. The unit of claim 23, wherein the first member includes a first perforated plate and wherein the second member includes a second perforated plate.

25. The unit of claim 23, wherein the first member includes a first perforated plate and a second perforated plate movable relative to the first perforated plate and wherein the second member includes an engagement portion configured to apply force to the second perforated plate to move the second perforated plate during connection of the second printed circuit board to the first printed circuit board.

26. The unit of claim 23, wherein the first member includes at least one pivoting louver and wherein the second member pivots the louver during connection of the second printed circuit board to the first printed circuit board.

27. The unit of claim 23 including at least one active component coupled to the second printed circuit board.

28. The unit of claim 26, wherein the first member includes a piston coupled to the at least one louver and wherein the second member engages the piston to pivot the at least one louver.

29. The unit of claim 28 including at least one component coupled to the second printed circuit board, wherein the second member has a length based upon a characteristic of the at least one component coupled to the second printed circuit board.

30. A method comprising:
   connecting a first printed circuit board carrying a first component and associated with a first member of an air flow blocking system to a second printed circuit board associated with a second member of the air flow blocking system configured to interact with the first member such that the first member interacts with the second member;

directing an air flow at the first component; and blocking the air flow based upon interaction between the first member and the second member.

31. The method of claim 30, wherein the first member is configured based upon characteristics of the components on the printed circuit board.

32. The method of claim 30 including pivoting an air flow blockage member based upon the characteristics of the components on the printed circuit board.

33. The method of claim 30 including translating an air flow blockage member based upon characteristics of components on the printed circuit board.

34. The method of claim 32 including pivoting the air flow blockage member between a fully closed position, a first open position and a second open position.

35. The method of claim 34 including translating the air flow blockage member between a fully closed position, a first open position and a second open position.

36. A computer system comprising:

an enclosure;

a backplane within the enclosure;

a replaceable unit releasably connected to the backplane;

an air cooling system configured to create an air flow along the replaceable unit; and an air flow blocking system including:

a first member coupled to the enclosure; and a second member coupled to the replaceable unit, wherein the first member and the second member interact to at least partially block air flow adjacent the replaceable unit based upon at least one characteristic of the replaceable unit.

37. The system of claim 36, wherein one of the first member and the second member moves the other of the first member and the second member during connection of the replaceable unit to the backplane.

38. The system of claim 36, wherein the first member includes an air flow blocking portion, wherein the air flow blocking portion moves between a plurality of blocking positions.

39. The system of claim 38, wherein the blocking portion pivots between the plurality of blocking positions.

40. The system of claim 38, wherein the blocking portion translates between the plurality of blocking positions.

* * * * *